(12) United States Patent
Kimura

(10) Patent No.: US 6,642,665 B2
(45) Date of Patent: Nov. 4, 2003

(54) DISPLAY DEVICE

(75) Inventor: Mutsumi Kimura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/233,402

(22) Filed: Sep. 4, 2002

(65) Prior Publication Data

US 2002/0195969 A1 Dec. 26, 2002

Related U.S. Application Data

(62) Division of application No. 10/112,710, filed on Apr. 2, 2002, now Pat. No. 6,469,450, which is a division of application No. 09/820,763, filed on Mar. 30, 2001, now Pat. No. 6,388,389, which is a division of application No. 09/468,356, filed on Dec. 21, 1999, now Pat. No. 6,225,750.

(30) Foreign Application Priority Data

Jan. 29, 1999 (JP) ............................. 11-021623
Oct. 22, 1999 (JP) ............................. 11-301448

(51) Int. Cl.[7] ................................. G09G 3/10
(52) U.S. Cl. ................ 315/169.3; 315/169.1; 345/84; 345/92; 345/211; 345/214
(58) Field of Search .......................... 315/169.1, 169.2, 315/169.3; 345/76, 84, 90, 92, 98, 211–214

(56) References Cited

U.S. PATENT DOCUMENTS

| 5,834,894 A | 11/1998 | Shirasaki et al. ............ 313/509 |
| 6,091,382 A | 7/2000 | Shioya et al. ................. 345/76 |
| 6,215,250 B1 | 4/2001 | Hirano et al. ............. 315/169.1 |
| 6,518,962 B2 * | 2/2003 | Kimura et al. ............... 345/211 |

FOREIGN PATENT DOCUMENTS

JP  11-73158  3/1999

* cited by examiner

Primary Examiner—Haissa Philogene
(74) Attorney, Agent, or Firm—Oliff & Berridge, PLC

(57) ABSTRACT

The invention provides a method and apparatus to obtain accurate gradation by obtaining an accurate ratio of light emitting parts in a display device which implements gradation by forming a plurality of TFTs and a plurality of OELDs in each pixel, directly connecting the TFTs and OELDs, and switching an on and off state of the TFTs, and controlling a light emitting area of the OELDs. A plurality of OELDs have the same shape, and gradation can be implemented by controlling the number of OELDs that emit light. A plurality of OELDs have a round shape. A plurality of OELDs are arranged at the same interval in a vertical and/or horizontal direction. According to this structure, because the light emitting areas of the plurality of OELDs become equal to each other, by controlling the number of OELDs, a ratio of the light emitting areas can be accurately obtained.

13 Claims, 7 Drawing Sheets

DISPLAY DEVICE

This is a Division of application Ser. No. 10/112,710 filed Apr. 2, 2002, now U.S. Pat. No. 6,469,450 which in turn is a divisional of Ser. No. 09/820,763 filed Mar. 30, 2001, now U.S. Pat. No. 6,388,389, which in turn is a divisional of Ser. No. 09/468,356 filed Dec. 21, 1999, now U.S. Pat. No. 6,225,750. The entire disclosure of the prior application(s) is hereby incorporated by reference herein in its entirety.

BACKGROUND OF THE INVENTION

1. Field of Invention

This invention relates to a display device, particularly a thin film transistor driven organic electro-luminescent display device (hereafter referred to as TFT-OELD) which is driven by a thin film transistor (hereafter referred to as TFT) and provided with an organic electro-luminescent element (hereafter referred to as OELD) of a high polymer system formed in a liquid phase process.

2. Description of Related Art

TFT-OELD is promising because it is a display device which realizes light-weightness, thinness, smallness, higher accuracy, wider view angle, lower electric consumption, and the like. FIG. 1 shows a conventional TFT-OELD. FIG. 2 shows a cross-sectional view of the conventional TFT-OELD. Here, there is only one pixel 11 depicted, but there are actually many pixels 11 in plural rows and lines. Here, OELD 18 is a high polymer system, formed by a liquid phase process, such as spin coating, blade coating, ink jet, or the like.

In order to implement gradation, in the case of the structure shown in FIG. 1, a gate voltage of a driving TFT 17 is made to change and conductance is changed, so electric current which flows in the OELD 18 needs to be controlled. However, gradation according to this method, particularly in half tone, result in irregularity of transistor characteristics of the driving TFT 17 and appears as brightness irregularity of the OELD 18, and there is a problem such that the screen becomes non-uniform.

Therefore, as shown in FIG. 3, a method is considered which implements gradation by changing a light emitting area of the OELD 18 (Japanese Patent Application 9-233107). FIG. 4 shows a driving method of this method. A scanning electric potential 31 is applied to a scanning line 12, and a signal line 13 is formed of a signal line (lower bit) 131 and a signal line (upper bit) 132. A signal electric potential (lower bit) 321 and signal electric potential (upper bit) 322 are respectively applied as a signal electric potential 32. A driving TFT 17 is formed of a driving TFT (lower bit) 171 and a driving TFT (upper bit) 172, and the OELD 18 is formed of an OELD (lower bit) 181 and an OELD (upper bit) 182. In this example, 2-bit 4 gradation is considered, so an area ratio between OELD (lower bit) 181 and OELD (upper bit) 182 is 1:2.

In this method, the driving TFT 17 takes either a substantially completely on state or a substantially completely off state. In the on state, the resistance of the driving TFT 17 is small enough to be ignored, compared to the resistance of OELD 18, and the electric current amount which flows in the driving TFT 17 and OELD 18 is substantially determined by only the resistance of the OELD 17.

Therefore, irregularity of transistor characteristics of the driving TFT 17 does not appear as brightness irregularity of the OELD 18. Furthermore, in the off state, voltage applied to the OELD 18 becomes less than a threshold voltage, so the OELD 18 does not emit light at all, and, needless to say, irregularity of transistor characteristics of the driving TFT 17 does not appear as brightness irregularity of the OELD 18.

FIG. 5 is a cross-sectional view of TFT-OELD which implements gradation display by changing a light emitting area of the OELD 18 shown in FIGS. 3 and 4. FIG. 5(a) is a cross-sectional view of the OELD (lower bit) 181, and FIG. 5(b) is a cross-sectional view of the OELD (upper bit) 182. The ratio between the light emitting part 25 of the OELD (lower bit) 181 and the light emitting part 25 of the OELD (upper bit) 182 is preferably 1:2.

A light emitting layer 22 is an OELD of a high polymer system and formed between anode 21 and cathode 23 in a liquid phase process. A surface of a bank 24 is lyophobic and the light emitting layer 22 does not remain. Therefore, the area of the OELD 18 is determined by patterning. With respect to a side surface of the bank 24, the materials and processing determine whether the side surface of the bank 24 becomes lyophobic or lyophilic.

FIG. 5 shows the case of a lyophilic side surface of the bank 24. As a phenomenon that is characteristic of a liquid phase process, the light emitting layer 22 has a cross-sectional shape which is pulled toward the side surface of the bank 24. In this case, electric current flows into a thinner part of the light emitting layer 22, and this part becomes a light emitting part 25. The cross-sectional shape of the light emitting layer 22 described here is sensitive to liquid amount, liquid material, an initial position of the liquid, and a state, temperature, atmosphere, or the like of a substrate, and which are difficult to control. That is, it is difficult to obtain an absolute value of a desired light emitting area. Because of this, it is difficult to obtain an accurate ratio of 1:2, between the light emitting part 25 of the OELD (lower bit) 181 and the light emitting part 25 of the OELD (upper bit) 182, and ultimately, it is difficult to obtain accurate gradation.

FIG. 6 is a cross-sectional view of OELD (lower bit) 181 (FIG. 6(a)) and a cross-sectional view of OELD (upper bit) 182 (FIG. 6(b)) in the same manner as in FIG. 5. In FIG. 6, the side surface of the bank 24 is lyophobic. As a phenomenon that is characteristic of a liquid phase process, the light emitting layer 22 has a cross-sectional shape which is distant from the side surface of the bank 24. In this case as well, electric current flows into the thinner part of the light emitting layer 22, and this part becomes the light emitting part 25. In this case as well, in the same manner as in the case of FIG. 5, it is difficult to obtain an accurate ratio of 1:2 between the light emitting part 25 of the OELD (lower bit) 181 and the light emitting part 25 of the OELD (upper bit) 182, so it is difficult to obtain accurate gradation.

SUMMARY OF THE INVENTION

Therefore, one aspect of this invention is to obtain an accurate ratio of the light emitting parts, and accurate gradation. Therefore, the invention may provide a display device in which gradation is implemented by forming a plurality of TFTs and a plurality of OELDs in each pixel, directly connecting the TFTs and OELDs, switching an on and off state of the TFTs, and controlling an area of the OELDs, that emits light, wherein the plurality of OELDs have the same shape, and gradation is implemented by controlling the number of OELDs that are created to emit light and by controlling an appropriate on/off state of the TFT connected to each OELD.

According to this structure, as a characteristic phenomenon of a liquid phase process, even if an OELD becomes a cross-sectional shape which is pulled in to a side surface of a bank or is distant from the side surface of the bank, the light emitting part of each OELD is the same area, and accurate gradation can be obtained. In this structure as well, it is difficult to obtain an absolute value of a desired light emitting area, but the light emitting area of a plurality of OELDs becomes equal, so the ratio of the light emitting areas can be accurate by controlling the number OELDs.

The display device may also include a plurality of OELDs that have a round shape. According to this structure, the light emitting part of each OELD can reliably be the same area, and accurate gradation can be obtained. The reasons are as follows. When an OELD has a shape with a rectangular vertex (or vertices), there is a possibility that a phenomenon may occur, for example, that the vertex becomes pulled in or the vertex cannot be filled. This phenomenon prevents a user from obtaining accurate gradation for the same reason as in the problems of a cross-sectional shape as described above. This phenomenon is more sensitive to the liquid amount, liquid material, initial position of liquid, and the state, temperature, and atmosphere of a substrate, more so than the problems in a cross-sectional shape described above, and it is difficult to control this phenomenon between adjacent OELDs. By making the OELD round shaped, this phenomenon can be avoided.

The display device may also include a plurality of OELDs are arranged at the same interval in a horizontal and/or vertical direction. According to this structure, the light emitting part of each OELD is made to be more reliably the same area, and accurate gradation can be obtained. The reasons are as follows. When OELD is formed by spin coating or blade coating, the light emitting layer which is coated over all the pixels, due to the lyophobicity of a surface of the bank, the light emitting layer naturally flows into a convex part of the bank. In the case of ink jet as well, this may sometimes happen. At this time, when a concave area surrounded by a bank convex part is large, the light emitting layer coated over this part flows into a convex bank portion, so the light emitting layer becomes thick. When the convex area surrounded by the bank concave part is small, the light emitting layer becomes thin. Ultimately, irregularity of film thickness of the light emitting layer is generated. This irregularity can be avoided by arranging a plurality of OELDs at the same interval in a horizontal or vertical direction.

Additionally, according to this structure, when the OELDs are formed by an ink jet process, ink jetting can be performed at the same interval, so fabrication can be simplified.

BRIEF DESCRIPTION OF THE DRAWINGS

FIG. 5(a) is a diagram of an OELD (lower bit) and FIG. 5(b) is a diagram of an OELD (upper bit);

FIG. 6(a) is a diagram of an OELD (lower bit), and FIG. 6(b) is a diagram of an OELD (upper bit);

DETAILED DESCRIPTION OF PREFERRED EMBODIMENTS

The following explains preferred embodiments of this invention, based upon the drawings.

Figure 1:
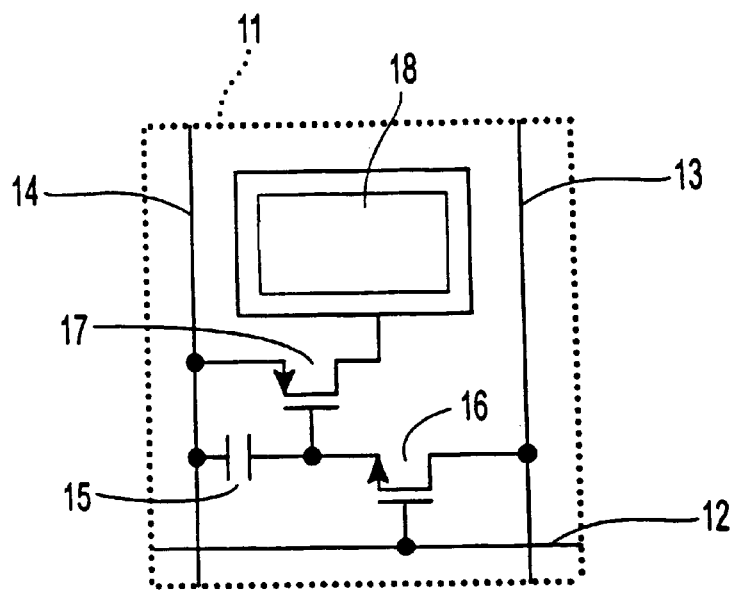
FIG. 1 is a diagram showing a pixel of conventional TFT-OELD which implements a gradation display by changing a TFT conductance.
Figure 2:
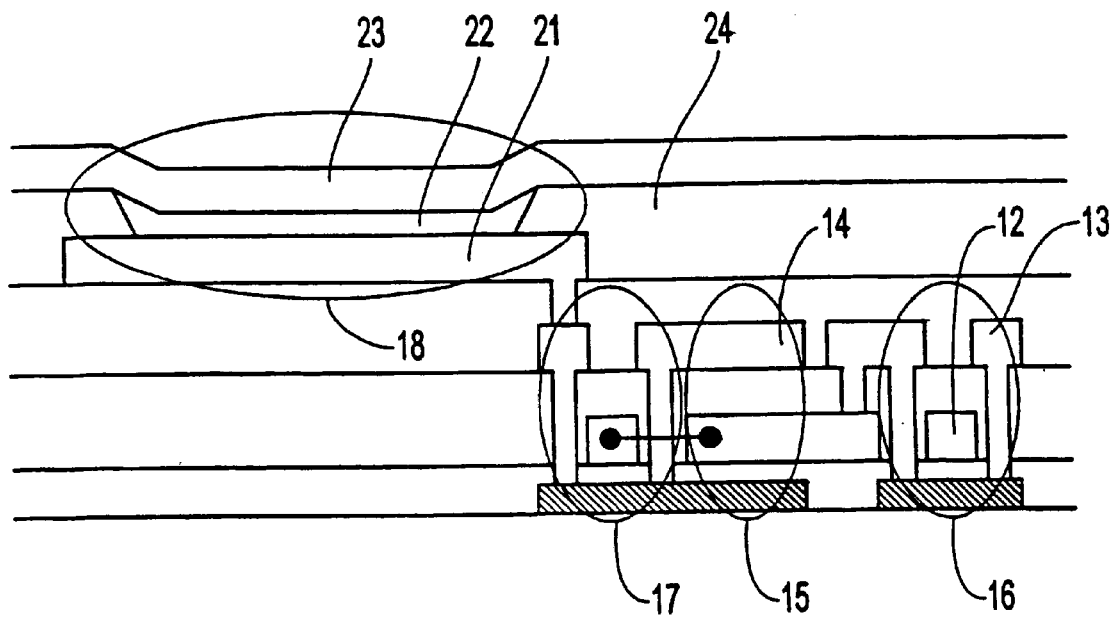
FIG. 2 is a cross-sectional view of a conventional TFT-OELD.
Figure 3:
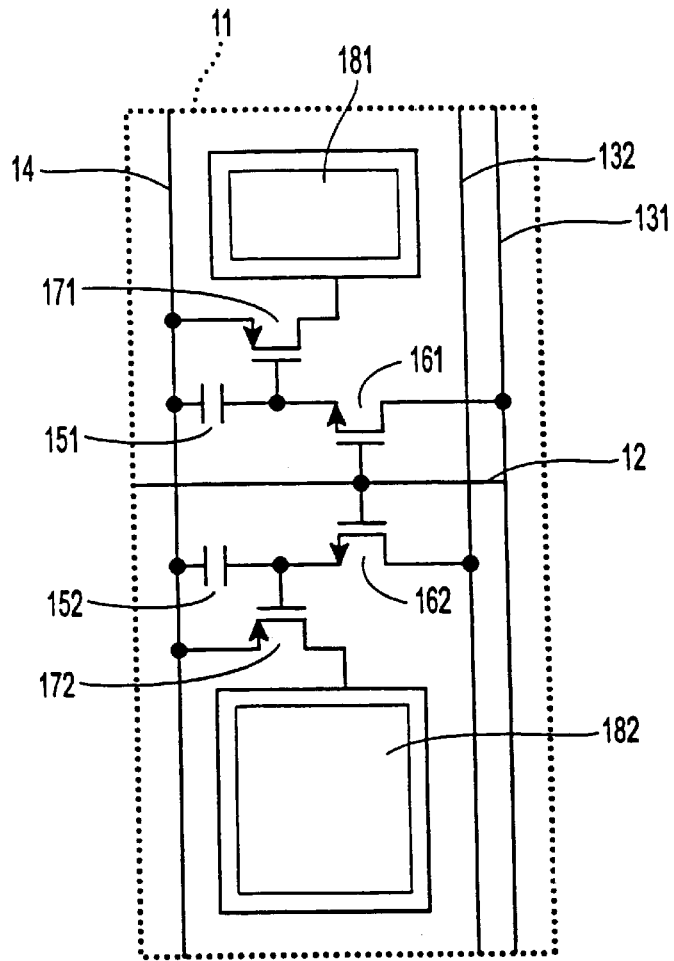
FIG. 3 is a diagram showing one pixel of a TFT-OELD which implements a gradation display by changing a conventional OELD light emitting area.
Figure 4:
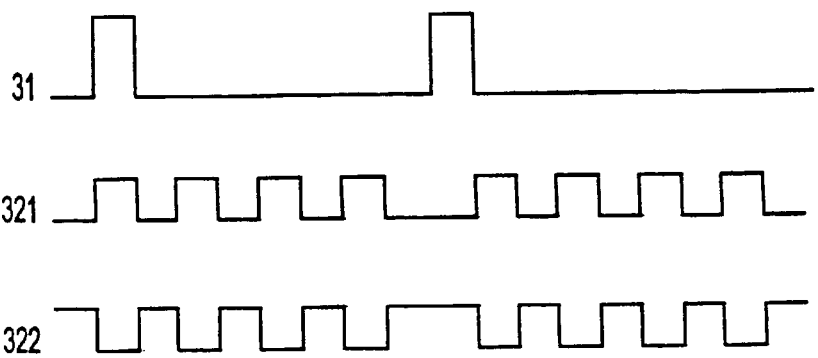
FIG. 4 is a diagram showing a TFT-OELD driving method which implements a gradation display by changing a conventional OELD light emitting area.
Figure 5A:
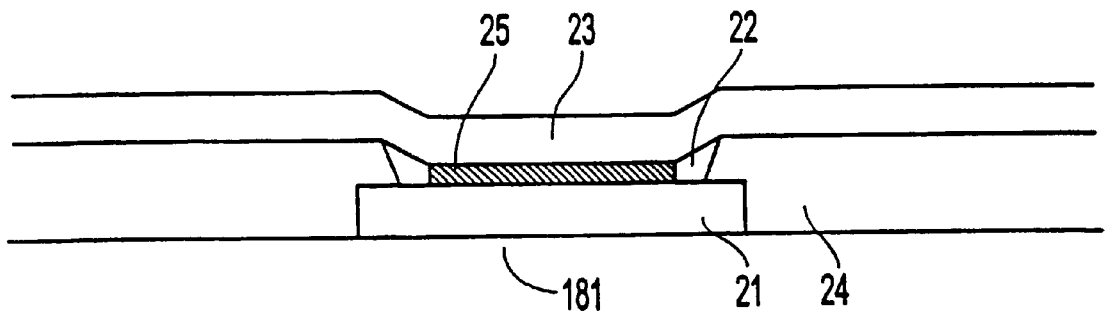
FIGS. 5(a) and 5(b) are cross-sectional views of an OELD in a TFT-OELD which implements a gradation display by changing a conventional OELD light emitting area (when the side surface of the bank is lyophilic), where
Figure 5B:
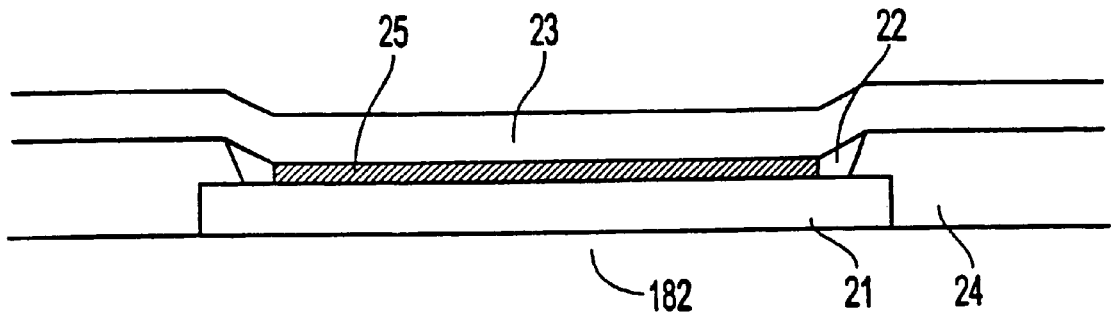
Figure 6A:
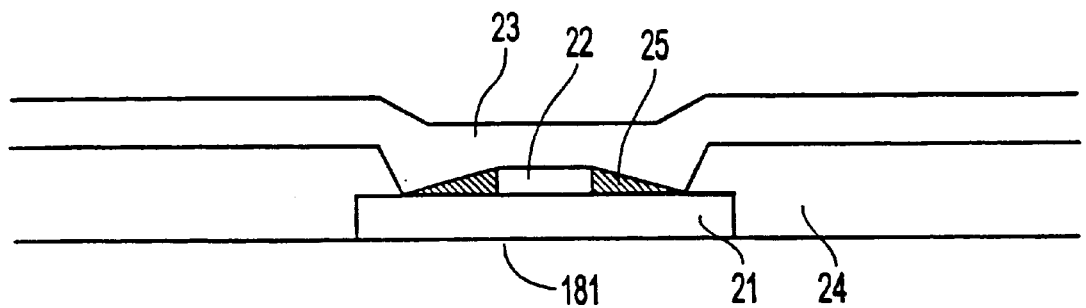
FIGS. 6(a) and 6(b) are cross-sectional views of an OELD in a TFT-OELD which implements a gradation display by changing a conventional OELD light emitting area (when the side surface of the bank is lyophobic), where
Figure 6B:
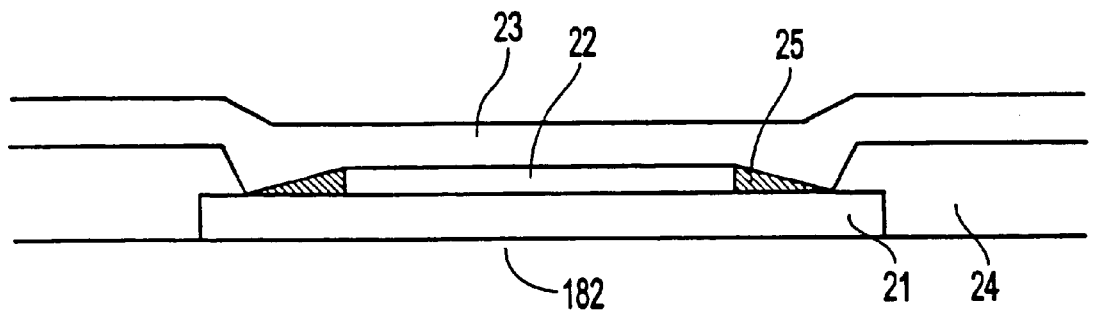
Figure 7:
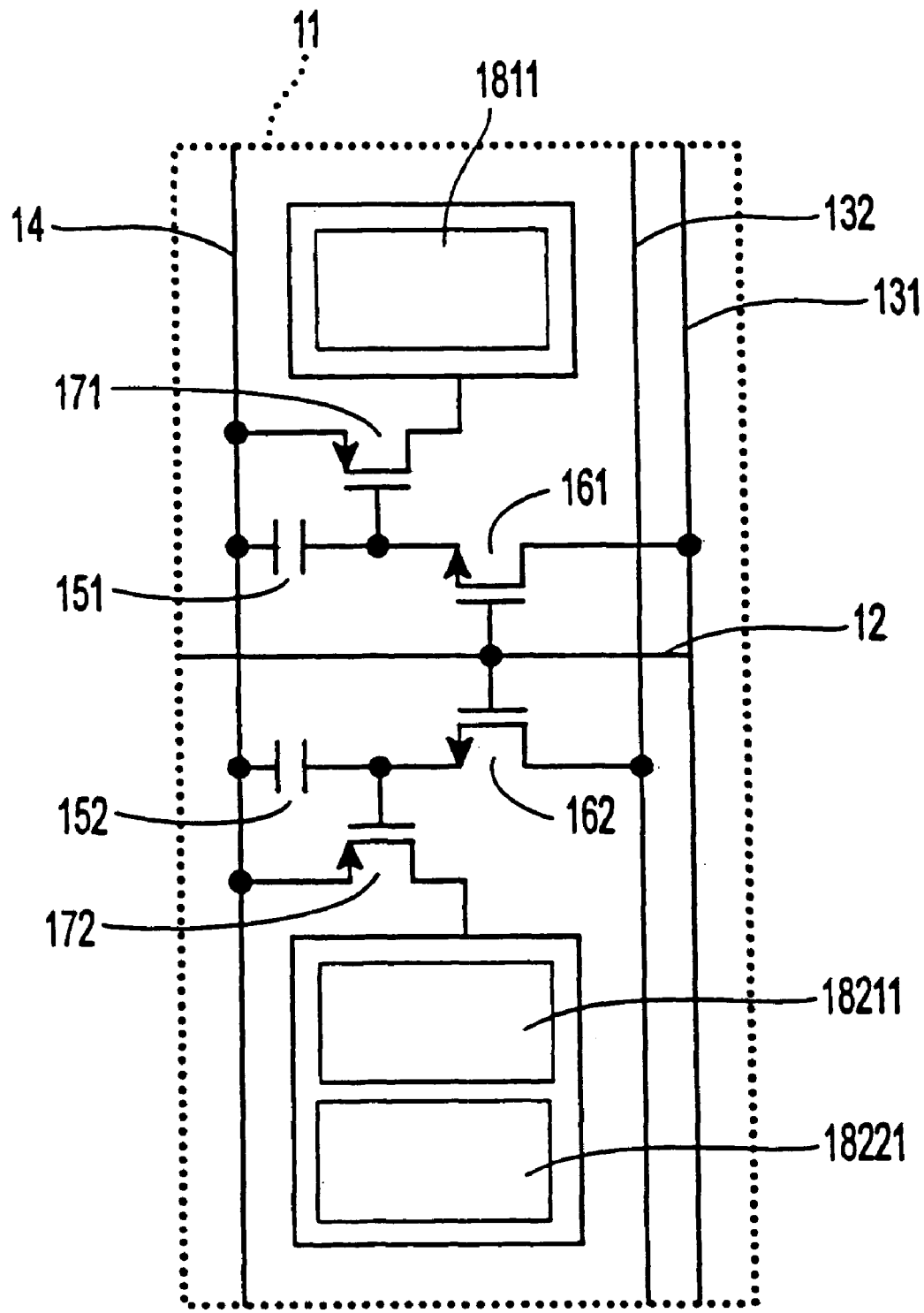
FIG. 7 is a diagram showing one pixel of a TFT-OELD related to embodiment 1 of this invention.

FIG. 7 is a diagram showing a pixel of a TFT-OELD related to a first embodiment of this invention. Here, only one pixel 11 is depicted, but many pixels 11 actually exist in a plurality of rows and a plurality of lines.

A holding capacitance element 15 is formed of capacitor 151 and capacitor 152, both connected to electric current supply line 14. A sampling TFT element 16 is formed of sampling TFT 161 and sampling TFT 162.

An OELD (lower bit) 181 is formed of OELD (lower bit•rectangular) 1811, and an OELD (upper bit) 182 is formed of OELD (upper bit•first•rectangular) 18211 and an OELD (upper bit•second•rectangular) 18221. The OELD (lower bit•rectangular) 1811, the OELD (upper bit•first•rectangular) 18211, and the OELD (upper bit•second•rectangular) 18221 have the same shape, so the same light emitting area can be obtained, and accurate gradation can be obtained by changing the number of OELDs that are caused to emit light.

Figure 8:
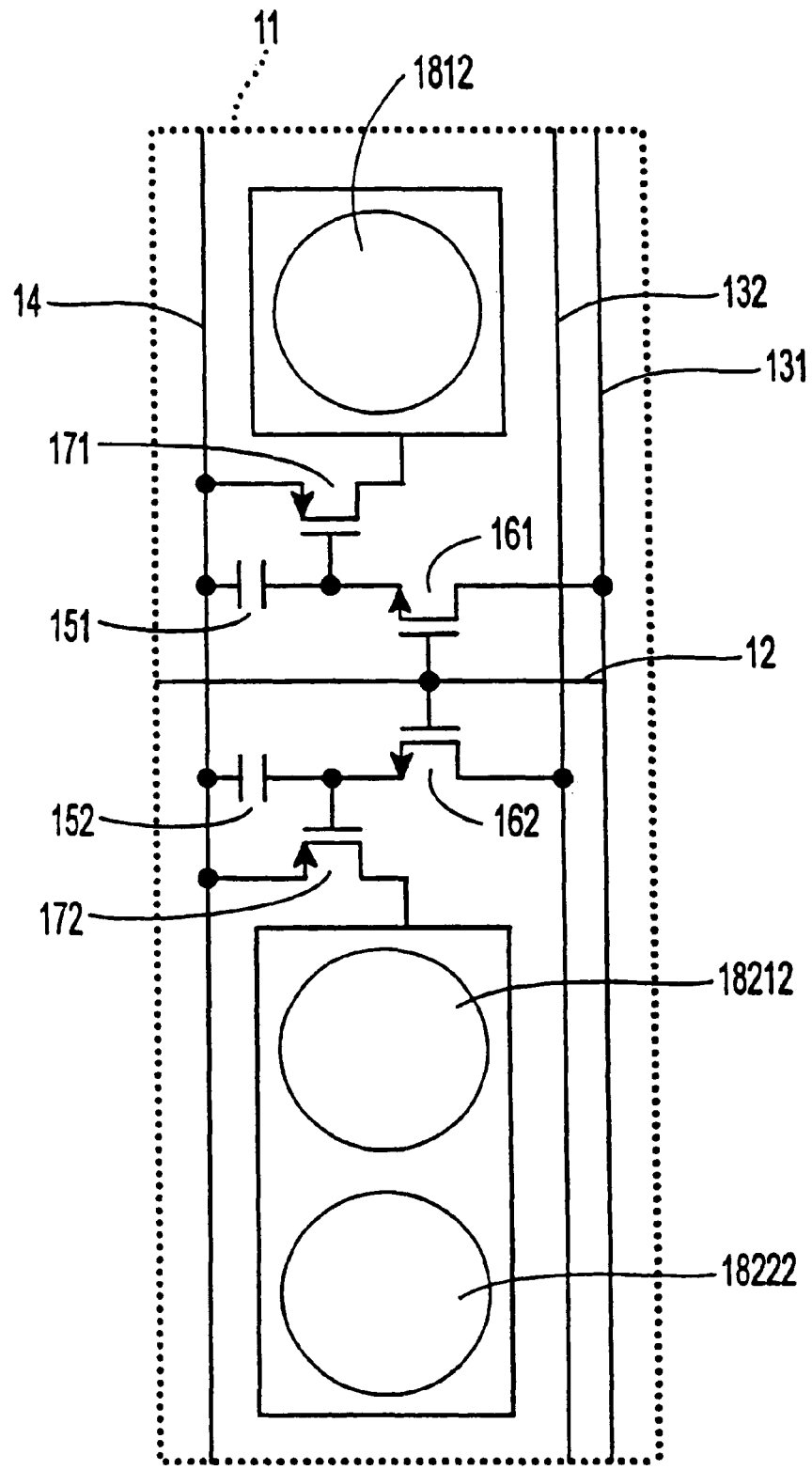
FIG. 8 is a diagram showing one pixel of a TFT-OELD related to embodiment 2 of this invention.

FIG. 8 is a diagram showing a pixel of a TFT-OELD related to another embodiment of this invention. Here, only one pixel 11 is depicted, but many pixels 11 actually exist in a plurality of lines and a plurality of rows.

An OELD (lower bit) 181 is formed of an OELD (lower bit•round shape) 1812, and an OELD (upper bit) 182 is formed of OELD (upper bit•first•round shape) 18212 and OELD (upper bit•second•round shape) 18222. The OELD (lower bit•round shape) 1812, the OELD (upper bit•first•round shape) 18212, and the OELD (upper bit•second•round shape) 18222 have the same round shape, so the same light emitting area can be reliably obtained, and accurate gradation can be obtained.

Figure 9:
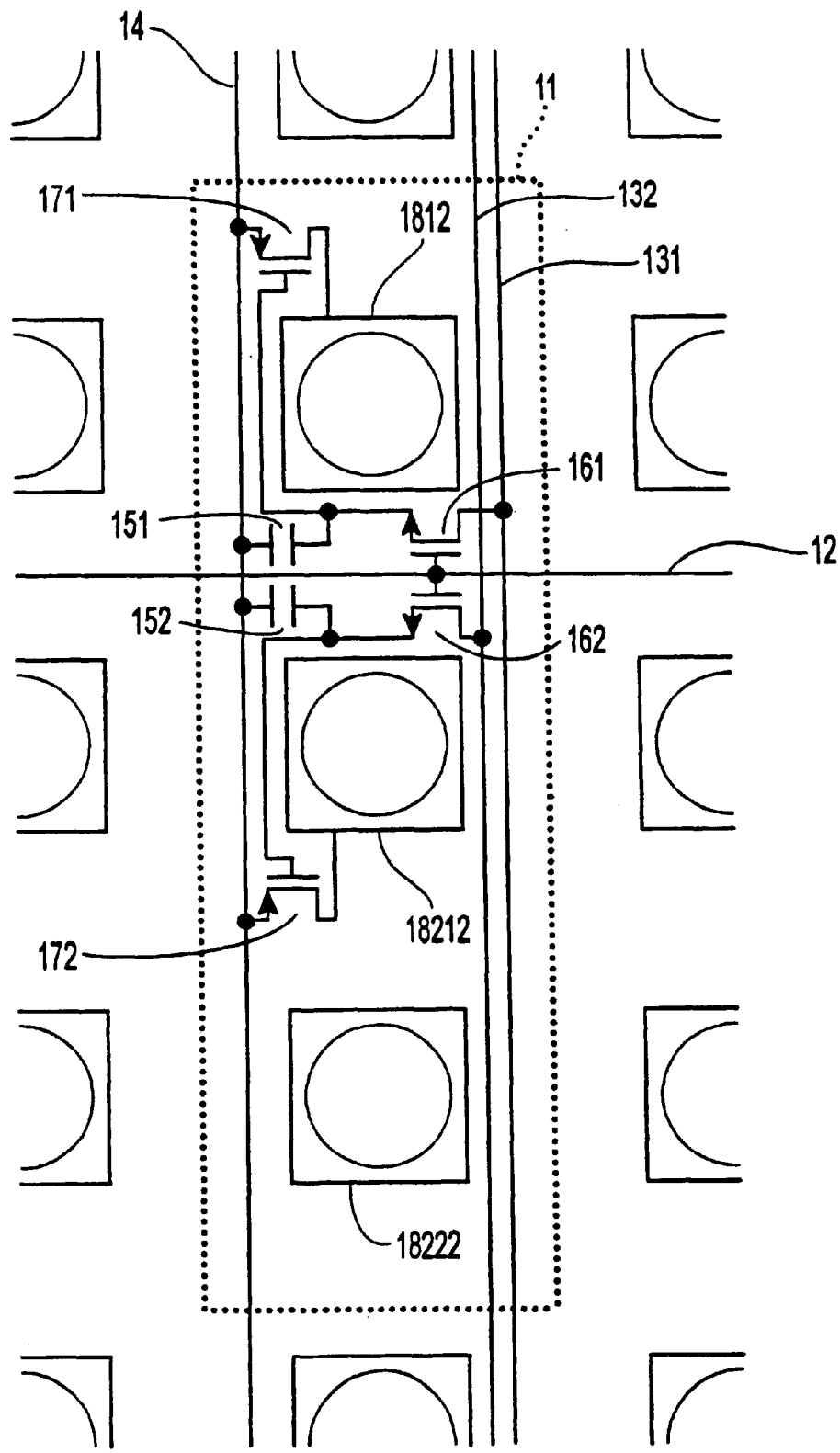
FIG. 9 is a diagram showing one pixel of a TFT-OELD related to embodiment 3 of this invention.

FIG. 9 is a diagram showing a pixel of a TFT-OELD related to another embodiment of this invention. Here, only one pixel 11 is depicted, but many pixels 11 actually exist in a plurality of lines and a plurality of rows.

An OELD (lower bit) 181 is formed of an OELD (lower bit•round shape) 1812, and an OELD (upper bit) 182 is formed of an OELD (upper bit•first•round shape) 18212 and an OELD (upper bit•second•round shape) 18222. The OELD (lower bit•round shape) 1812, the OELD (upper bit•first•round shape) 18212, and the OELD (upper bit•second•round shape) 18222 are arranged at the same interval in horizontal and vertical directions within the pixel 11, and also with respect to the adjacent pixel 11. Because of this, the light emitting part of each OELD can more reliably have the same area, and accurate gradation can be obtained.

Furthermore, as an EL element formed in each pixel, in first embodiment (FIG. 7), a rectangular element is shown as an example, and in the second and third embodiments (FIGS. 8 and 9, respectively), a round-shaped element is shown, but this invention is not limited to these. Accurate gradation can also be obtained in a polygonal- or elliptic-shaped element. In particular, an elliptic element, as in the case of a round shape, does not have a vertex such as is present in the case of a rectangular shape, so there is no problem such that the vertex cannot be filled by the light emitting layer.

Each of FIGS. 7–9 provide lower and upper TFT's 171, 172, respectively, comprising on/off states contributing to the control of gradation in the lower OELD (1811, FIG. 7; 1812, FIGS. 8 and 9) and upper OELD's (18211 and 18221, FIG. 7; 18212 and 18222, FIGS. 8 and 9) each respective TFT corresponds to.

As described above, according to this invention, by controlling the area of an electro-luminescent element that emits light, accurate gradation can be realized.

What is claimed is:

1. A display device, comprising:
   a plurality of scanning lines;
   a plurality of data lines including a first bit data line and a second bit data line; and
   a plurality of pixels, each of the plurality of pixels including:
      a plurality of sampling transistors including a first sampling transistor connected to the first bit data line and a second sampling transistor connected to the second bit data line; and
      a plurality of light emitting elements including a first group having at least, light emitting element and a second group having a plurality of light emitting elements, the first group being controlled by a data signal supplied through the first bit data line and the first sampling transistor, and the second group being together controlled by a data signal supplied through the second bit data line and the second sampling transistor.

2. The display device according to claim 1,
   the plurality of light emitting elements having a same emitting area.

3. The display device according to claim 1,
   the plurality of light emitting elements having a same shape.

4. The display device according to claim 1,
   each of the plurality of pixels further including a plurality of driving transistors,
   the plurality of driving transistors including a first driving transistor and a second driving transistor,
   the first driving transistor being connected to the at least one light emitting element included in the first group, and the second driving transistor being connected to the light emitting elements included in the second group.

5. The display device according to claim 1,
   gates of the first sampling transistor and the second sampling transistor being connected to one of the plurality of scanning lines.

6. The display device according to claim 4, further comprising a plurality of power supply lines, the plurality of driving transistors being connected to one of the plurality of power supply lines.

7. The display device according to claim 1,
   each of the plurality of light emitting elements taking any one of an emissive state and a non-emissive state.

8. The display device according to claim 4,
   each of the plurality of driving transistors taking any one of a substantially completely on state and a substantially completely off state.

9. A display device, comprising:
   a plurality of scanning lines;
   a plurality of data lines including a first bit data line and a second bit data line; and
   a plurality of pixels, each of the plurality of pixels including:
      a plurality of sampling transistors including a first sampling transistor connected to the first bit data line and a second sampling transistor connected to the second bit data line; and
      a plurality of light emitting elements including a first group having one light emitting element and a second group having at least two light emitting elements, the first group being controlled by a data signal supplied through the first bit data line and the first sampling transistor, and the second group being together controlled by a data signal supplied through the second bit data line and the second sampling transistor.

10. The display device according to claim 9,
    gates of the first sampling transistor and the second sampling transistor being connected to one of the plurality of scanning lines.

11. The display device according to claim 9,
    each of the plurality of pixels further including a plurality of driving transistors,
    the plurality of driving transistors including a first driving transistor and a second driving transistor,
    the first driving transistor being connected to the one light emitting element included in the first group, and the second driving transistor being connected to the at least two light emitting elements included in the second group.

12. The display device according to claim 11,
    each of the plurality of driving transistors taking any one of a substantially completely on state and a substantially completely off state.

13. The display device according to claim 9,
    the plurality of light emitting elements having a same emitting area.

* * * * *